(12) United States Patent
Ko et al.

(10) Patent No.: US 11,844,244 B2
(45) Date of Patent: Dec. 12, 2023

(54) DISPLAY DEVICE HAVING A FIRST CONTACT ELECTRODE AND A SECOND CONTACT ELECTRODE

(71) Applicant: Samsung Display Co., Ltd., Yongin-si (KR)

(72) Inventors: Min Suk Ko, Cheonan-si (KR); Tae Wook Kang, Seongnam-si (KR); Kab Jong Seo, Hwaseong-si (KR); Bo Geon Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 17/444,745

(22) Filed: Aug. 9, 2021

(65) Prior Publication Data

US 2022/0140024 A1 May 5, 2022

(30) Foreign Application Priority Data

Nov. 3, 2020 (KR) .......................... 10-2020-0145194

(51) Int. Cl.
| | |
|---|---|
| *H01L 29/08* | (2006.01) |
| *H10K 59/122* | (2023.01) |
| *H10K 50/816* | (2023.01) |
| *H10K 50/828* | (2023.01) |
| *H10K 59/124* | (2023.01) |
| *H10K 71/00* | (2023.01) |

(52) U.S. Cl.
CPC ......... *H10K 59/122* (2023.02); *H10K 50/816* (2023.02); *H10K 50/828* (2023.02); *H10K 59/124* (2023.02); *H10K 71/00* (2023.02)

(58) Field of Classification Search
CPC .. H10K 59/122; H10K 59/124; H10K 50/816; H10K 50/828; H10K 71/00
USPC .......................................................... 257/40
See application file for complete search history.

(56) References Cited

U.S. PATENT DOCUMENTS

| | | | |
|---|---|---|---|
| 2010/0013383 A1 | 1/2010 | Kim et al. | |
| 2018/0145256 A1 | 5/2018 | Yang et al. | |
| 2018/0175106 A1* | 6/2018 | Kim | ........ H01L 33/20 |
| 2021/0391380 A1 | 12/2021 | Li et al. | |

FOREIGN PATENT DOCUMENTS

| | | | | |
|---|---|---|---|---|
| CN | 1941442 A | * | 4/2007 | ............ H01L 33/14 |
| CN | 108539049 A | * | 9/2018 | |
| CN | 108808444 A | * | 11/2018 | ......... H01S 5/18305 |
| JP | 2005084248 A | * | 3/2005 | |

(Continued)

*Primary Examiner* — Phuc T Dang
(74) *Attorney, Agent, or Firm* — Lewis Roca Rothgerber Christie LLP

(57) ABSTRACT

A display device includes: a substrate; first banks spaced apart from each other on the substrate; a first electrode and a second electrode covering the first banks and spaced apart from each other; a light-emitting element between the first electrode and the second electrode; a first contact electrode connected to the first electrode and contacting one end of the light-emitting element; and a second contact electrode connected to the second electrode and contacting another end of the light-emitting element. The first contact electrode includes a first material, the second contact electrode includes a second material, and physical properties of the first material and the second material are different from each other.

15 Claims, 19 Drawing Sheets

(56) References Cited

FOREIGN PATENT DOCUMENTS

| KR | 20160046679 A | * | 4/2016 | |
|---|---|---|---|---|
| KR | 10-2019-0029831 A | | 3/2019 | |
| WO | WO-2018058381 A1 | * | 4/2018 | ............. C23C 14/18 |
| WO | WO 2020/075935 A1 | | 4/2020 | |
| WO | WO-2020130249 A1 | * | 6/2020 | ......... H01L 25/0753 |

* cited by examiner

DISPLAY DEVICE HAVING A FIRST CONTACT ELECTRODE AND A SECOND CONTACT ELECTRODE

CROSS-REFERENCE TO RELATED APPLICATION

This application claims priority to and the benefit of Korean Patent Application No. 10-2020-0145194, filed on Nov. 3, 2020 in the Korean Intellectual Property Office, the disclosure of which is incorporated herein by reference in its entirety.

BACKGROUND

1. Field

Aspects of embodiments of the present disclosure relate to a display device and a method of manufacturing the same.

2. Description of the Related Art

With the advancement of the information-centric society, demands for a display device of various forms for displaying an image are increasing. The display device may be applied to various electronic devices, such as a smartphone, a digital camera, a laptop, a navigation device, and a smart TV. The display device may be a flat panel display device, such as a liquid crystal display device, a field emission display device, or an organic light-emitting display device. From among the flat panel display devices, the light-emitting display device includes a light-emitting element through which each pixel of a display panel may emit light by itself (e.g., may be self-emissive) so that an image may be displayed even though the display panel does not have a backlight unit that provides light.

The light-emitting display panel may have a multi-layer structure including a bank layer, a plurality of electrode layers, and a plurality of insulating layers.

When a first contact electrode and a second contact electrode are formed on different layers, an element insulating layer for covering the first contact electrode and an element insulating layer for covering the second contact electrode should be individually formed. This process, however, increases costs for equipment for forming the element insulating layer(s).

Accordingly, a method of forming the first contact electrode and the second contact electrode on the same layer may be considered to omit formation of an additional element insulating layer, but in this case, there is a limit to the resolution of an exposure machine for forming the first contact electrode and the second contact electrode or an overlay ability of the exposure machine.

SUMMARY

An embodiment of the present disclosure provides a method of manufacturing a display device by forming a first contact electrode and a second contact electrode on the same layer and allows for the first contact electrode and the second contact electrode to be easily formed regardless of the resolution of an exposure machine or an overlay ability of the exposure machine.

Another embodiment of the present disclosure provides a display device manufactured by the above-mentioned method.

Aspects and features of the present disclosure are not limited to those mentioned above, and other technical aspects and features not mentioned above will be clearly understood by those skilled in the art from the following description.

According to an embodiment of the present disclosure, a display device includes a substrate; first banks on the substrate and spaced apart from each other; a first electrode and a second electrode on and covering the first banks and spaced apart from each other; a light-emitting element between the first electrode and the second electrode; a first contact electrode connected to the first electrode and contacting one end of the light-emitting element; and a second contact electrode connected to the second electrode and contacting the other end of the light-emitting element. The first contact electrode includes a first material, the second contact electrode includes a second material, and physical properties of the first material and the second material are different from each other.

According to another embodiment of the present disclosure, a method of manufacturing a display device is provided. The method includes a substrate preparation operation of preparing a substrate on which first banks are spaced apart from each other; an electrode forming operation of forming a first electrode and a second electrode on and covering the first banks and spaced apart from each other; a first element insulating layer forming operation of forming a first element insulating layer on the first electrode and the second electrode; a light-emitting element disposing operation of disposing a light-emitting element between the first electrode and the second electrode on the first element insulating layer; a second element insulating layer forming operation of forming a second element insulating layer on an upper surface of the light-emitting element; a first contact electrode material forming operation of forming a first contact electrode material layer on the entire second element insulating layer; a first contact electrode forming operation of forming a first contact electrode exposing a central portion and an end portion of another side of the second element insulating layer; a second contact electrode material forming operation of forming a second contact electrode material on the entire first contact electrode; and a second contact electrode forming operation of forming a second contact electrode exposing a central portion and an end portion of one side of the second element insulating layer. The first contact electrode includes a first material, and the second contact electrode includes a second material, and physical properties of the first material and the second material are different from each other.

Aspects and features of other embodiments are included in the detailed description that follows and drawings.

DETAILED DESCRIPTION

Figure 1:
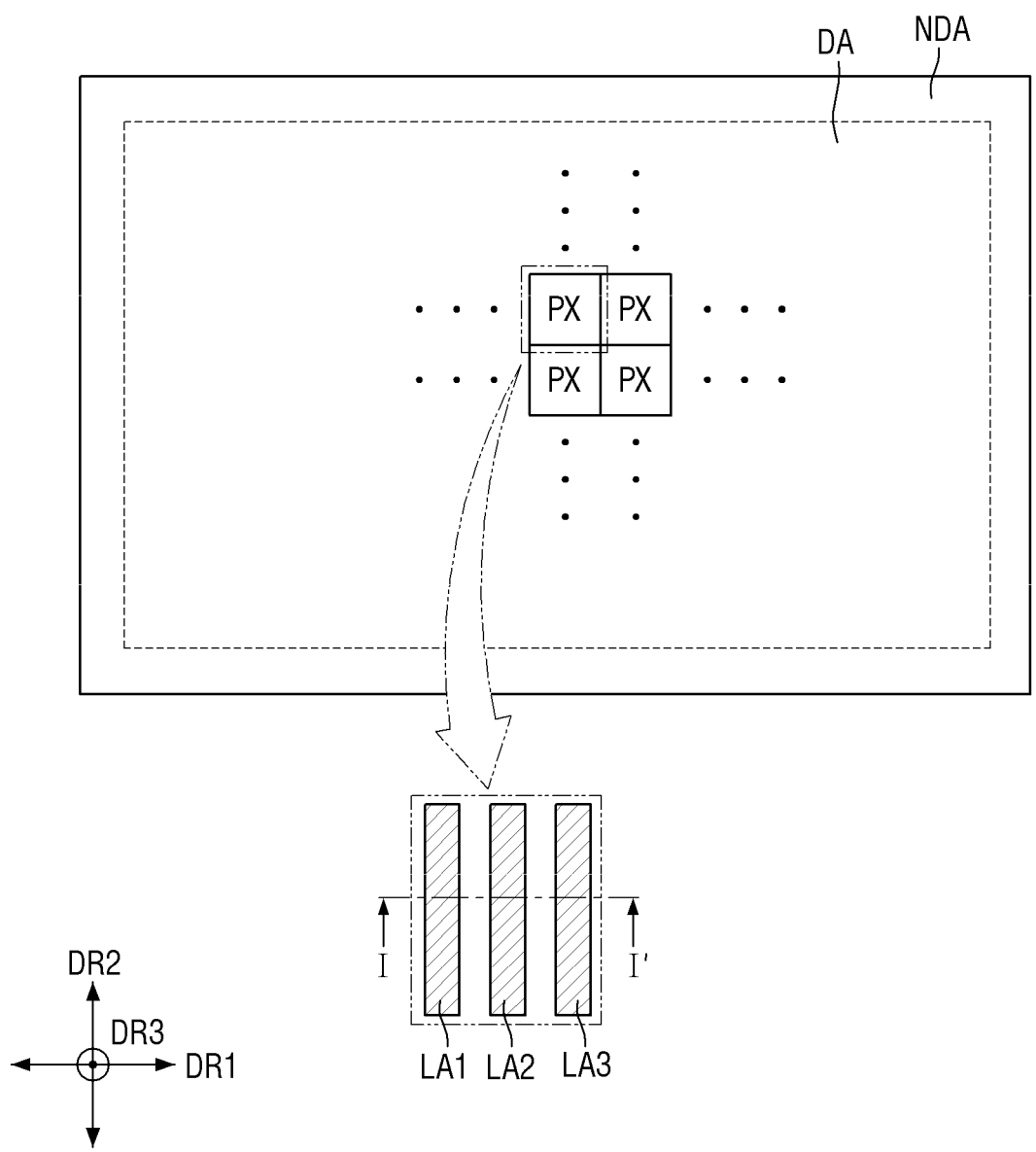
FIG. 1 is a plan view showing a display device according to an embodiment.

Structural and functional descriptions of embodiments of the present disclosure disclosed herein are for purposes of describing embodiments of the present disclosure. The present disclosure may be embodied in many different forms without departing from the spirit and scope of the present disclosure. Therefore, embodiments of the present disclosure are disclosed for illustrative purposes and should not be construed as limiting the present disclosure. The present disclosure is defined by the scope of the claims and their equivalents.

It will be understood that when an element is referred to as being related to another element, such as being "coupled" or "connected" to another element, it can be directly coupled or connected to the other element or intervening elements may be present therebetween. It should be understood that when an element is referred to as being related to another element, such as being "directly coupled" or "directly connected" to another element, there are no intervening elements present. Other expressions that explain the relationship between elements, such as "between," "directly between," "adjacent to," or "directly adjacent to," should be understood in the same way.

Throughout the specification, the same reference numerals will refer to the same or like parts.

It will be understood that, although the terms "first," "second," "third," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a," "an," "the," and "at least one" do not denote a limitation of quantity and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes," "including," and/or "have," or variations thereof, when used in this specification, specify the presence of stated features, regions, integers, steps, operations, elements, and/or components but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can, therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, the terms "use," "using," and "used" may be considered synonymous with the terms "utilize," "utilizing," and "utilized," respectively. "About" or "approximately" as used herein is inclusive of the stated value and means within an acceptable range of deviation for the particular value as determined by one of ordinary skill in the art considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result of, for example, manufacturing techniques and/or tolerances, are to be expected. Thus, embodiments described herein should not be construed as limited to the particular shapes of regions as illustrated herein but are to include deviations in shapes that result from, for example, manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is a plan view showing a display device according to an embodiment.

Referring to FIG. 1, a display device according to an embodiment may have a rectangular planar shape. However, the present disclosure is not limited thereto, and the display device may have a square shape, a circular shape, an elliptical shape, or other polygonal shapes. Hereinafter, an embodiment in which a rectangle shape is applied as the planar shape of the display device will be primarily described.

The display device includes a display panel that provides (or includes) a display screen. As an example of the display panel, an inorganic light-emitting diode display panel, an organic light-emitting display panel, a quantum dot light-emitting display panel, a plasma display panel, and a field emission display panel may be implemented. Hereinafter, an embodiment in which the inorganic light-emitting diode display panel is applied as an example of the display panel is illustrated and will be described, but the present disclosure is not limited thereto. When the same technical spirit is applicable, it may also be applied to other display panels.

The display device may have a display area DA and a non-display area NDA. The display area DA may include a plurality of pixels PX to display an image. The plurality of pixels PX may be arranged in a matrix manner. The non-display area NDA may be arranged around the display area DA to surround (e.g., to extend around a periphery of) the display area DA and may not display an image. The non-display area NDA may completely surround the display area DA on a plane. The display area DA may be referred to as an active area, and the non-display area NDA may be referred to as an inactive area. The display area DA may generally occupy a center of the display device.

The non-display area NDA may be positioned on one side in a first direction DR1, the other side in the first direction DR1, one side in a second direction DR2, and the other side in the second direction DR2 of the display area DA, respectively. However, the present disclosure is not limited thereto, and the non-display area NDA may be positioned only on one side and the other side in the first direction DR1 of the display area DA, or may be positioned only on one side and the other side in the second direction DR2. Lines or circuit driving units included in the display device may be disposed or external devices may be mounted in each of the non-display areas NDA.

Referring to an enlarged view of FIG. 1, in the pixel PX of the display device, each of the plurality of pixels may include light-emitting areas LA1, LA2, and LA3 defined by a pixel defining film, and the light-emitting areas LA1, LA2, and LA3 may emit light having a peak wavelength (e.g., a predetermined peak wavelength). For example, the display area DA of the display device may include first to third light-emitting areas LA1, LA2, and LA3. Each of the first to third light-emitting areas LA1, LA2, and LA3 may be an area in which light generated by a light-emitting element of the display device is emitted to the outside of the display device.

The first to third light-emitting areas LA1, LA2, and LA3 may emit light having a peak wavelength to the outside of the display device. The first light-emitting area LA1 may emit light of a first color, the second light-emitting area LA2 may emit light of a second color, and the third light-emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm, but the present disclosure is not limited thereto.

The display area DA of the display device may include a light blocking area positioned between adjacent light-emitting areas LA1, LA2, and LA3. For example, the light blocking area positioned between the light-emitting areas may surround the first to third light-emitting areas LA1 to LA3.

Figure 2:
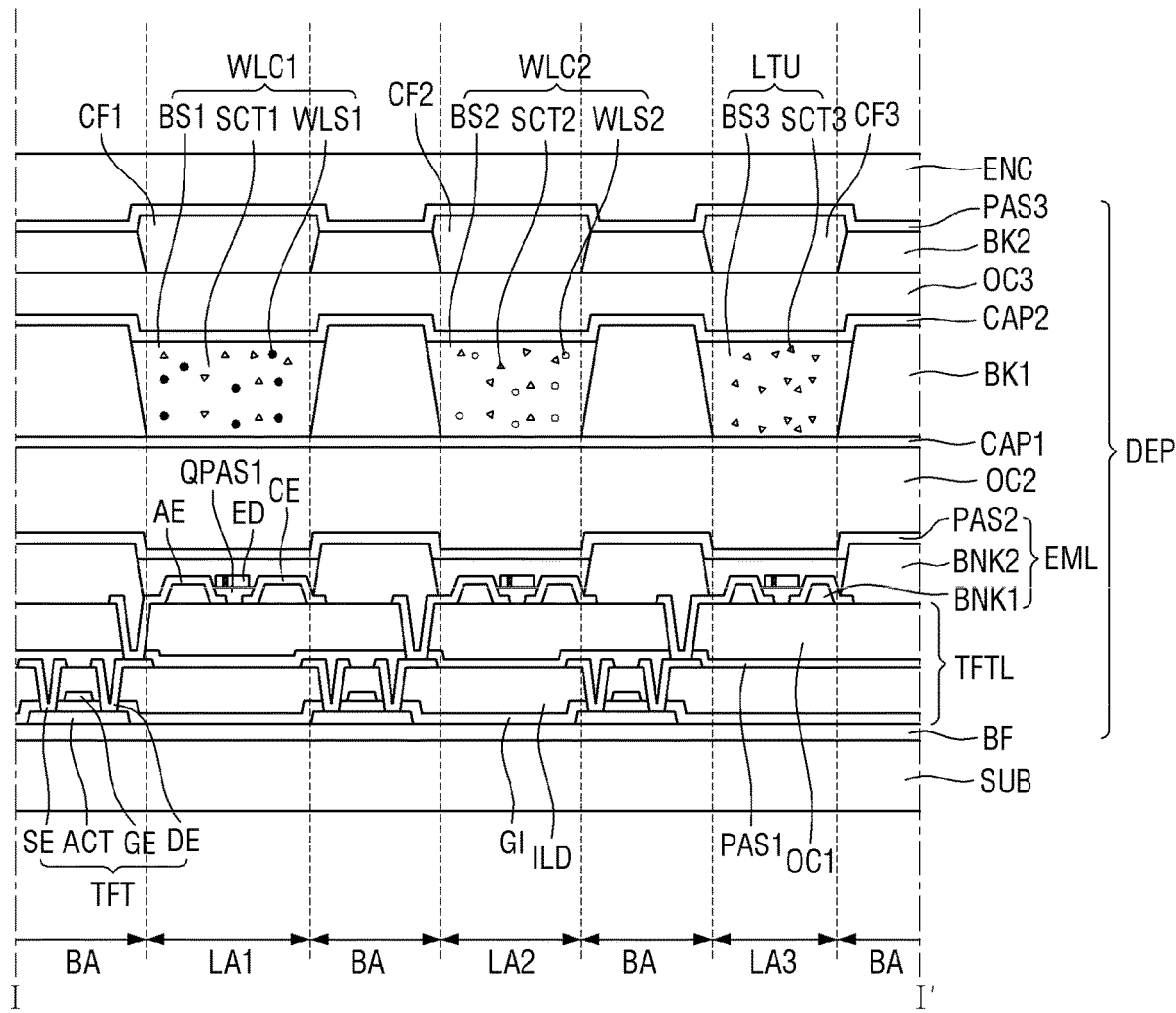
FIG. 2 is an enlarged cross-sectional view taken along the line I-I' of FIG. 1.

FIG. 2 is an enlarged cross-sectional view taken along the line I-I' of FIG. 1.

Referring to FIG. 2, the display device may include a substrate portion (e.g., a substrate) SUB disposed across the display area DA and the non-display area NDA, a display element layer DEP on the substrate portion SUB disposed in the display area DA, and an encapsulation member ENC disposed across the display area DA and the non-display area NDA and sealing the display element layer DEP.

The substrate portion SUB may include (or may be made of) an insulating material, such as a polymer resin. The insulating material may include (or may contain), for example, polyimide (PI), but present disclosure is not limited thereto. When two substrate portions (e.g., two substrates) are provided, the first substrate portion and the second substrate portion may include (or contain) the same material.

The display element layer DEP may include a buffer layer BF, a thin film transistor layer TFTL, a light-emitting element layer EML, a second planarization layer OC2, a first capping layer CAP1, a first light blocking member BK1, a first wavelength conversion unit WLC1, a second wavelength conversion unit WLC2, a light transmission unit LTU, a second capping layer CAP2, a third planarization layer OC3, a second light blocking member BK2, first to third color filters CF1, CF2, and CF3, a third protective layer PAS3, and the encapsulation member ENC.

The buffer layer BF may be disposed on a substrate 100. The buffer layer BF may include (or may be made of) an inorganic film capable of preventing or substantially preventing the penetration of air or moisture.

The thin film transistor layer TFTL may include a thin film transistor TFT, a gate insulating film GI, an interlayer insulating film ILD, a first protective layer PAS1, and a first planarization layer OC1.

The thin film transistor TFT may be disposed on the buffer layer BF, and may constitute a pixel circuit of each of the plurality of pixels.

A semiconductor layer ACT may be provided on the buffer layer BF. The semiconductor layer ACT may overlap a gate electrode GE, a source electrode SE, and a drain electrode DE. The semiconductor layer ACT may directly contact the source electrode SE and the drain electrode DE and may face the gate electrode GE with the gate insulating film GI therebetween.

The gate electrode GE may be disposed on the gate insulating film GI. The gate electrode GE may overlap the semiconductor layer ACT with the gate insulating film GI therebetween.

The source electrode SE and the drain electrode DE may be disposed to be spaced apart from each other on the interlayer insulating film ILD. The source electrode SE may contact one end of the semiconductor layer ACT through a contact opening (e.g., a contact hole) provided in the gate insulating film GI and the interlayer insulating film ILD. The drain electrode DE may contact the other end of the semiconductor layer ACT through a contact opening (e.g., a contact hole) provided in the gate insulating film GI and the interlayer insulating film ILD. The drain electrode DE may contact a first electrode AE of a light-emitting member EL through a contact opening (e.g., a contact hole) provided in the first protective layer PAS1 and the first planarization layer OC1.

The gate insulating film GI may be provided on the semiconductor layer ACT. For example, the gate insulating film GI may be disposed on the semiconductor layer ACT and the buffer layer BF and may insulate the semiconductor layer ACT and the gate electrode GE. The gate insulating film GI may have a contact opening (e.g., a contact hole) through which the source electrode SE passes and a contact opening (e.g., a contact hole) through which the drain electrode DE passes.

The interlayer insulating film ILD may be disposed on the gate electrode GE. For example, the interlayer insulating film ILD may have the contact opening through which the source electrode SE passes and the contact opening through which the drain electrode DE passes.

The first protective layer PAS1 may be provided on the thin film transistor TFT to protect the thin film transistor TFT. For example, the first protective layer PAS1 may have a contact opening (e.g., a contact hole) through which the first electrode AE passes.

The first planarization layer OC1 may be provided on the first protective layer PAS1 to planarize an upper end of the thin film transistor TFT. For example, the first planarization layer OC1 may have the contact opening through which the first electrode AE of the light-emitting member EL passes.

The light-emitting element layer EML may include the light-emitting member EL, a first bank BNK1, a second bank BNK2, a first element insulating layer QPAS1, and a second protective layer PAS2.

The light-emitting member EL may be provided on the thin film transistor TFT. The light-emitting member EL may include the first electrode AE, a second electrode CE, and a light-emitting element ED.

The first electrode AE may be provided on the first planarization layer OC1. For example, the first electrode AE may be disposed on the first bank BNK1 and disposed on the first planarization layer OC1 to cover the first bank BNK1. The first electrode AE may be disposed to overlap one of the first to third light-emitting areas LA1, LA2, and LA3 defined by the second bank BNK2. In addition, the first electrode AE may be connected to the drain electrode DE of the thin film transistor TFT.

The second electrode CE may be provided on the first planarization layer OC1. For example, the second electrode CE may be disposed on the first bank BNK1 and disposed on the first planarization layer OC1 to cover the first bank BNK1. The second electrode CE may be disposed to overlap one of the first to third light-emitting areas LA1, LA2, and LA3 defined by the second bank BNK2. For example, the second electrode CE may receive a common voltage supplied to all pixels.

The first element insulating layer QPAS1 may cover a portion of the first electrode AE and a portion of the second electrode CE adjacent to each other and may insulate the first electrode AE and the second electrode CE.

The light-emitting element ED may be disposed between the first electrode AE and the second electrode CE on the first planarization layer OC1. The light-emitting element ED may be disposed on the first element insulating layer QPAS1. One end of the light-emitting element ED may be connected to the first electrode AE, and the other end of the light-emitting element ED may be connected to the second electrode CE. For example, a plurality of light-emitting elements ED (e.g., each of the light-emitting elements ED) may include an active layer having the same material to emit light of the same wavelength band or light of the same color. Light emitted from each of the first to third light-emitting areas LA1, LA2, and LA3 may have the same color. For example, the plurality of light-emitting elements ED may emit light of a third color (e.g., blue light having a peak wavelength in the range of about 440 nm to about 480 nm).

The second bank BNK2 may be disposed on the first planarization layer OC1 to define the first to third light-emitting areas LA1, LA2, and LA3. For example, the second bank BNK2 may surround (e.g., may extend around a periphery of) each of the first to third light-emitting areas LA1, LA2, and LA3, but the present disclosure is not limited thereto. For example, in some embodiments the second bank BNK2 may be disposed in a light blocking area BA.

The second protective layer PAS2 may be disposed on a plurality of light-emitting members EL and the second bank BNK2. The second protective layer PAS2 may cover the plurality of light-emitting members EL and may protect the plurality of light-emitting members EL.

The display device may further include the second planarization layer OC2, the first capping layer CAP1, the first light blocking member BK1, the first wavelength conversion unit WLC1, the second wavelength conversion unit WLC2, the light transmission unit LTU, the second capping layer CAP2, the third planarization layer OC3, the second light blocking member BK2, the first to third color filters CF1, CF2, and CF3, the third protective layer PAS3, and the encapsulation member ENC.

The second planarization layer OC2 may be provided on the light-emitting element layer EML to planarize an upper end (e.g., an upper side or surface) of the light-emitting element layer EML. The second planarization layer OC2 may include (or may contain) an organic material.

The first capping layer CAP1 may be disposed on the second planarization layer OC2. The first capping layer CAP1 may seal lower surfaces of the first and second wavelength conversion units WLC1 and WLC2 and the light transmission unit LTU. The first capping layer CAP1 may include (or may contain) an inorganic material.

The first light blocking member BK1 may be disposed in the light blocking area BA on the first capping layer CAP1. The first light blocking member BK1 may overlap the second bank BNK2 in a thickness direction. The first light blocking member BK1 may block or substantially block the transmission of light.

The first light blocking member BK1 may include (or may contain) an organic light blocking material and a liquid-repellent component (or element).

Because the first light blocking member BK1 includes the liquid-repellent component, the first and second wavelength conversion units WLC1 and WLC2 and the light transmission unit LTU may be separated into corresponding light-emitting areas LA.

The first wavelength conversion unit WLC1 may be disposed in the first light-emitting area LA1 on the first capping layer CAP1. The first wavelength conversion unit WLC1 may be surrounded by (e.g., surrounded along a periphery by) the first light blocking member BK1. The first wavelength conversion unit WLC1 may include a first base resin BS1, a first scatterer (e.g., a first scattering particle) SCT1, and a first wavelength shifter WLS1.

The first base resin BS1 may include a material having relatively high light transmittance. The first base resin BS1 may include (or may be made of) a transparent organic material. For example, the first base resin BS1 may include at least one of an organic material, such as an epoxy resin, an acrylic resin, a cardo resin, and an imide resin.

The first scatterer SCT1 may have a refractive index different from that of the first base resin BS1 and may form an optical interface with the first base resin BS1.

The first wavelength shifter WLS1 may convert (or shift) a peak wavelength of incident light to a first peak wavelength. For example, the first wavelength shifter WLS1 may convert blue light provided from the display device into red light having a single peak wavelength in the range of about 610 nm to about 650 nm to emit the converted light. The first wavelength shifter WLS1 may be a quantum dot, a quantum rod, or a phosphor. The quantum dot may be particulate matter that emits a specific color as electrons transition from a conduction band to a valence band.

Light emitted by the first wavelength shifter WLS1 may have a full width at half maximum (FWHM) of an emission wavelength spectrum of about 45 nm or less, about 40 nm or less, or about 30 nm or less, and the color purity and color reproducibility of a color displayed by the display device may be further improved.

Some of blue light provided from the light-emitting element layer EML may pass through the first wavelength conversion unit WLC1 without being converted into red light by the first wavelength shifter WLS1. From among the blue light provided by the light-emitting element layer EML, light incident on the first color filter CF1 without being converted by the first wavelength conversion unit WLC1 may be blocked by the first color filter CF1. In addition, the red light converted by the first wavelength conversion unit WLC1 from among the blue light provided from the display device may pass through the first color filter CF1 to be emitted to the outside. Therefore, the first light-emitting area LA1 may emit the red light.

The second wavelength conversion unit WLC2 may be disposed in the second light-emitting area LA2 on the first capping layer CAP1. The second wavelength conversion unit WLC2 may be surrounded by (e.g., surrounded along a periphery by) the first light blocking member BK1. The second wavelength conversion unit WLC2 may include a second base resin BS2, a second scatterer (e.g., a second scattering particle) SCT2, and a second wavelength shifter WLS2.

The second base resin BS2 may include (or may contain) a material having relatively high light transmittance. The second base resin BS2 may include (or may be made of) a transparent organic material.

The second scatterer SCT2 may have a refractive index different from that of the second base resin BS2 and may form an optical interface with the second base resin BS2. For example, the second scatterer SCT2 may include light scattering materials or light scattering particles that scatter at least some of the transmitted light.

The second wavelength shifter WLS2 may convert (or shift) a peak wavelength of incident light to a second peak wavelength different from the first peak wavelength of the first wavelength shifter WLS1. For example, the second wavelength shifter WLS2 may convert blue light provided from the display device into green light having a single peak wavelength in the range of about 510 nm to about 550 nm to emit the converted light. The second wavelength shifter WLS2 may be a quantum dot, a quantum rod, or a phosphor. The second wavelength shifter WLS2 may include (or may contain) a material having the same effect as the material exemplified for the first wavelength shifter WLS1.

The light transmission unit LTU may be disposed in the third light-emitting area LA3 on the first capping layer CAP1. The light transmission unit LTU may be surrounded by (e.g., surrounded along a periphery by) the first light blocking member BK1. The light transmission unit LTU may maintain the peak wavelength of the incident light to transmit the incident light. The light transmission unit LTU may include a third base resin BS3 and a third scatterer (e.g., a third scattering particle) SCT3.

The third base resin BS3 may include (or may contain) a material having relatively high light transmittance. The third base resin BS3 may include (or may be made of) a transparent organic material.

The third scatterer SCT3 may have a refractive index different from that of the third base resin BS3 and may form an optical interface with the third base resin BS3. For example, the third scatterer SCT3 may include light scattering materials or light scattering particles that scatter at least some of the transmitted light.

The first and second wavelength conversion units WLC1 and WLC2 and the light transmission unit LTU are disposed on the light-emitting element layer EML through the second planarization layer OC2 and the first capping layer CAP1, and thus, a separate substrate for the first and second wavelength conversion units WLC1 and WLC2 and the light transmission unit LTU may be omitted.

The second capping layer CAP2 may cover the first and second wavelength conversion units WLC1 and WLC2, the light transmission unit LTU, and the first light blocking member BK1.

The third planarization layer OC3 may be disposed on the second capping layer CAP2 to planarize upper ends (e.g., upper sides or surfaces) of the first and second wavelength conversion units WLC1 and WLC2 and the light transmission unit LTU. The third planarization layer OC3 may include (or may contain) an organic material.

The second light blocking member BK2 may be disposed in the light blocking area BA on the third planarization layer OC3. The second light blocking member BK2 may overlap the first light blocking member BK1 or the second bank BNK2 in the thickness direction. The second light blocking member BK2 may block or substantially block the transmission of light.

The first color filter CF1 may be disposed in the first light-emitting area LA1 on the third planarization layer OC3. The first color filter CF1 may be surrounded by (e.g., surrounded along a periphery by) the second light blocking member BK2. The first color filter CF1 may overlap the first wavelength conversion unit WLC1 in the thickness direction. The first color filter CF1 may selectively transmit light of a first color (e.g., red light) and may block or absorb light of a second color (e.g., green light) and light of a third color (e.g., blue light).

The second color filter CF2 may be disposed in the second light-emitting area LA2 on the third planarization layer OC3. The second color filter CF2 may be surrounded by (e.g., surrounded along a periphery by) the second light blocking member BK2. The second color filter CF2 may overlap the second wavelength conversion unit WLC2 in the thickness direction. The second color filter CF2 may selectively transmit light of a second color (e.g., green light) and may block or absorb light of a first color (e.g., red light) and light of a third color (e.g., blue light).

The third color filter CF3 may be disposed in the third light-emitting area LA3 on the third planarization layer OC3. The third color filter CF3 may be surrounded by (e.g., surrounded along a periphery by) the second light blocking member BK2. The third color filter CF3 may overlap the light transmission unit LTU in the thickness direction. The third color filter CF3 may selectively transmit light of a third color (e.g., blue light) and may block or absorb light of a first color (e.g., red light) and light of a second color (e.g., green light).

The first to third color filters CF1, CF2, and CF3 may absorb some of light introduced from the outside of the display device to reduce reflected light due to external light. Therefore, the first to third color filters CF1, CF2, and CF3 may prevent or substantially prevent color distortion due to reflection of the external light.

The third protective layer PAS3 may cover the first to third color filters CF1, CF2, and CF3. The third protective layer PAS3 may protect the first to third color filters CF1, CF2, and CF3.

The encapsulation member ENC may be disposed on the third protective layer PAS3. For example, the encapsulation member ENC may include at least one inorganic film to prevent or substantially prevent the penetration of oxygen or moisture. Also, the encapsulation member ENC may include at least one organic film to protect the display device from foreign matter, such as dust.

Figure 3:
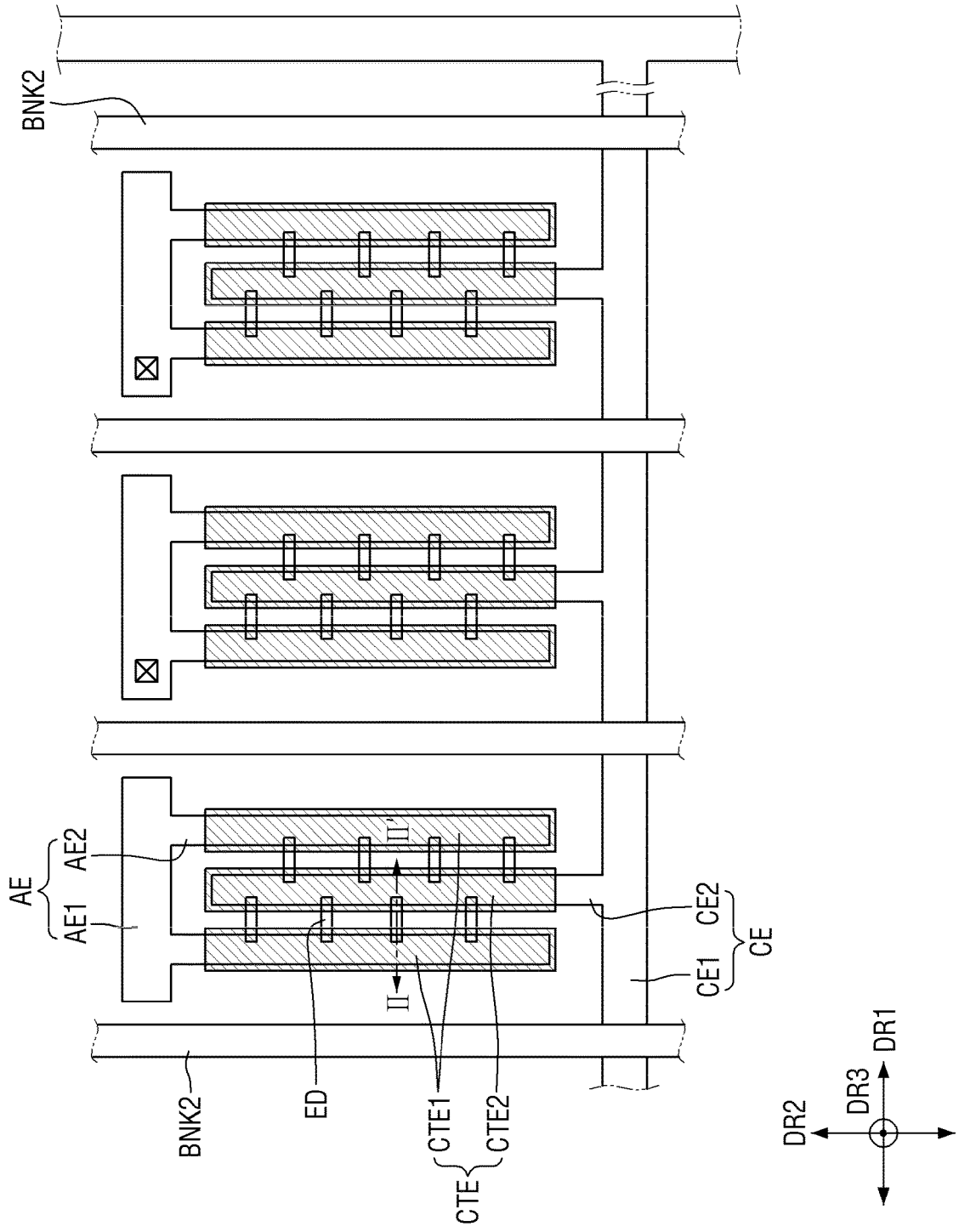
FIG. 3 is a plan view showing one pixel of a display device according to an embodiment.
Figure 4:
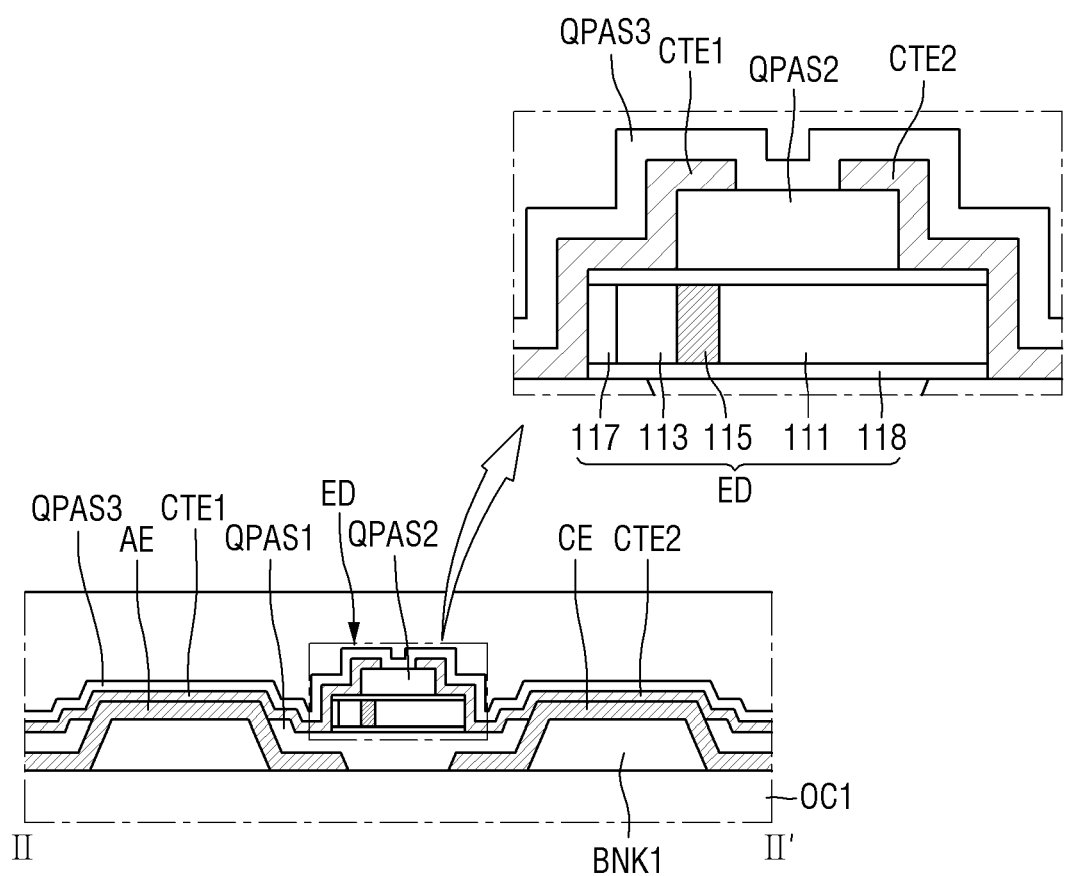
FIG. 4 is a cross-sectional view taken along the line II-II' of FIG. 3.

FIG. 3 is a plan view showing one pixel of a display device according to an exemplary embodiment, and FIG. 4 is a cross-sectional view taken along the line II-II' of FIG. 3.

Referring to FIGS. 3 and 4 together with FIG. 2, each of the plurality of pixels may include first to third sub-pixels. Each of the first to third sub-pixels may correspond to each of the first to third light-emitting areas LA1, LA2, and LA3. A light-emitting element ED of each of the first to third sub-pixels may emit light through the first to third light-emitting areas LA1, LA2, and LA3.

Each of the first to third sub-pixels may emit light of the same color. For example, each of the first to third sub-pixels may include the same type of light-emitting element ED and may emit light of a third color (e.g., blue light). As another example, the first sub-pixel may emit light of a first color (e.g., red light), the second sub-pixel may emit light of a second color (e.g., green light), and the third sub-pixel may emit light of a third color (e.g., blue light).

Each of the first to third sub-pixels may include the first and second electrodes AE and CE, the light-emitting element ED, a plurality of contact electrodes CTE, and a plurality of second banks BNK2.

The first and second electrodes AE and CE may be electrically connected to the light-emitting element ED to receive a voltage (e.g., a predetermined voltage), and the light-emitting element ED may emit light of a specific wavelength band. At least a part of the first and second electrodes AE and CE may form an electric field in a pixel, and the light-emitting element ED may be aligned by the electric field.

For example, the first electrode AE may be a pixel electrode separated for each of the first to third sub-pixels, and the second electrode CE may be a common electrode commonly connected to the first to third sub-pixels. One of the first electrode AE and the second electrode CE may be an anode of the light-emitting element ED, and the other may be a cathode of the light-emitting element ED.

The first electrode AE may include a first electrode stem portion AE1 extending in the first direction DR1 and at least one first electrode branch portion AE2 branched from the first electrode stem portion AE1 and extending in the second direction DR2.

The first electrode stem portion AE1 of each of the first to third sub-pixels may be spaced apart from the first electrode stem portion AE1 of an adjacent sub-pixel, and the first electrode stem portion AE1 may be disposed on a virtual extension line with the first electrode stem portion AE1 of the sub-pixel adjacent in the first direction DR1. The first electrode stem portion AE1 of each of the first to third sub-pixels may receive different signals and may be independently driven.

The first electrode branch portion AE2 may be branched from the first electrode stem portion AE1 to extend in the second direction DR2. One end of the first electrode branch portion AE2 may be connected to the first electrode stem portion AE1, and the other end of the first electrode branch portion AE2 may be spaced apart from a second electrode stem portion CE1 facing the first electrode stem portion AE1.

The second electrode CE may include the second electrode stem portion CE1 extending in the first direction DR1 and a second electrode branch portion CE2 branched from the second electrode stem portion CE1 to extend in the second direction DR2. The second electrode stem portion CE1 of each of the first to third sub-pixels may be connected to the second electrode stem portion CE1 of an adjacent sub-pixel. The second electrode stem portion CE1 may extend in the first direction DR1 to cross the plurality of pixels. The second electrode stem portion CE1 may be connected to an outer portion of the display area DA or a portion extending in one direction from the non-display area NDA.

The second electrode branch portion CE2 may be spaced apart from the first electrode branch portion AE2 to face each other. One end of the second electrode branch portion CE2 may be connected to the second electrode stem portion CE1, and the other end of the second electrode branch portion CE2 may be spaced apart from the first electrode stem portion AE1.

The first electrode AE may be electrically connected to the thin film transistor layer TFTL of the display device through a first contact opening (e.g., a first contact hole) CNT1, and the second electrode CE may be electrically connected to the thin film transistor layer TFTL of the display device through a second contact opening (e.g., a second contact hole) CNT2. For example, the first contact opening CNT1 may be disposed in each of the plurality of first electrode stem portions AE1, and the second contact opening CNT2 may be disposed in the second electrode stem portion CE1, but the present disclosure is not limited thereto.

The second bank BNK2 may be disposed at a boundary between the plurality of pixels. The plurality of first electrode stem portions AE1 may be spaced apart from each other based on the second bank BNK2. The second bank BNK2 may extend in the second direction DR2 and may be disposed at a boundary of pixels SP arranged in the first direction DR1. Additionally, the second bank BNK2 may also be disposed at a boundary of the pixels SP arranged in the second direction DR2. The second bank BNK2 may define a boundary between the plurality of pixels.

When manufacturing the display device, the second bank BNK2 may prevent or substantially prevent ink from crossing the boundary of the pixels SP when the ink in which the light-emitting element ED is dispersed is sprayed (or deposited). The second bank BNK2 may separate the pixels SP so that the inks in which different light-emitting elements ED are dispersed are not mixed.

The light-emitting element ED may be disposed between the first electrode AE and the second electrode CE. One end of the light-emitting element ED may be connected to the first electrode AE, and the other end of the light-emitting element ED may be connected to the second electrode CE.

The plurality of light-emitting elements ED may be disposed to be spaced apart from each other and may be substantially aligned in parallel with each other. The spacing between the light-emitting elements ED is not particularly limited.

The plurality of light-emitting elements ED may include an active layer having the same material and may emit light of the same wavelength band or light of the same color. The first to third sub-pixels may emit light of the same color. For example, the plurality of light-emitting elements ED may emit light of a third color (e.g., blue light) having a peak wavelength in the range of about 440 nm to about 480 nm.

The contact electrode CTE may include first and second contact electrodes CTE1 and CTE2. The first contact electrode CTE1 may cover the first electrode branch portion AE2 and a part of the light-emitting element ED and may electrically connect the first electrode branch portion AE2 and the light-emitting element ED. The second contact electrode CTE2 may cover the second electrode branch portion CE2 and another part of the light-emitting element ED and electrically connect the second electrode branch portion CE2 and the light-emitting element ED.

The first contact electrode CTE1 may be disposed on the first electrode branch portion AE2 to extend in the second direction DR2. The first contact electrode CTE1 may contact one end of the light-emitting element ED. The light-emitting element ED may be electrically connected to the first electrode AE through the first contact electrode CTE1.

The second contact electrode CTE2 may be disposed on the second electrode branch portion CE2 to extend in the second direction DR2. The second contact electrode CTE2 may be spaced apart from the first contact electrode CTE1 in the first direction DR1. The second contact electrode CTE2 may contact the other end of the light-emitting element ED. The light-emitting element ED may be electrically connected to the second electrode CE through the second contact electrode CTE2.

The light-emitting element layer EML of the display device may be disposed on the thin film transistor layer TFTL and may include first to third element insulating layers QPAS1, QPAS2, and QPAS3.

The plurality of first banks BNK1 may be disposed in each of the first to third light-emitting areas LA1, LA2, and LA3. Each of the plurality of first banks BNK1 may correspond to the first electrode AE or the second electrode CE. Each of the first and second electrodes AE and CE may be disposed on a corresponding first bank BNK1. For example, the plurality of first banks BNK1 may be disposed on the first planarization layer OC1, and a side surface of each of the plurality of first banks BNK1 may be inclined from the first planarization layer OC1. An inclined surface of the first bank BNK1 may reflect the light emitted from the light-emitting element ED.

The first electrode stem portion AE1 may have the first contact opening CNT1 passing through the first planarization layer OC1. The first electrode stem portion AE1 may be electrically connected to the thin film transistor TFT through the first contact opening CNT1.

The second electrode stem portion CE1 may extend in the first direction DR1 and may also be disposed in a non-emitting area in which the light-emitting element ED is not disposed. The second electrode stem portion CE1 may have the second contact opening CNT2 passing through the first planarization layer OC1. The second electrode stem portion CE1 may be electrically connected to a power electrode through the second contact opening CNT2. The second electrode CE may receive an electrical signal (e.g., a predetermined electrical signal) from the power electrode.

The first and second electrodes AE and CE may include (or contain) a transparent conductive material. The first and second electrodes AE and CE may include (or contain) a conductive material having high reflectivity. The first and second electrodes AE and CE may have a structure in which one or more layers of a transparent conductive material and a metal having high reflectivity are stacked, or may be formed as a single layer including them.

The first element insulating layer QPAS1 may be disposed on the first planarization layer OC1, the first electrode AE, and the second electrode CE. The first element insulating layer QPAS1 may cover a portion of each of the first and second electrodes AE and CE.

The first element insulating layer QPAS1 may protect the first and second electrodes AE and CE and may insulate the first and second electrodes AE and CE from each other. The first element insulating layer QPAS1 may prevent or substantially prevent the light-emitting element ED from being damaged by direct contact with other members.

The light-emitting element ED may be disposed between the first electrode AE and the second electrode CE on the first element insulating layer QPAS1. One end of the light-emitting element ED may be connected to the first electrode AE, and the other end of the light-emitting element ED may be connected to the second electrode CE.

The second element insulating layer QPAS2 may be partially disposed on the light-emitting element ED disposed between the first and second electrodes AE and CE. The second element insulating layer QPAS2 may be disposed in a central portion of an upper surface of the light-emitting element ED. The third element insulating layer QPAS3 may partially surround an outer surface of the light-emitting element ED. The third element insulating layer QPAS3 may protect the light-emitting element ED. The third element insulating layer QPAS3 may surround the outer surface of the light-emitting element ED.

The contact electrode CTE may include first and second contact electrodes CTE1 and CTE2. The first contact electrode CTE1 may cover the first electrode branch portion AE2 and a part of the light-emitting element ED and may electrically connect the first electrode branch portion AE2 and the light-emitting element ED. The second contact electrode CTE2 may cover the second electrode branch portion CE2 and another part of the light-emitting element ED and may electrically connect the second electrode branch portion CE2 and the light-emitting element ED The first contact electrode CTE1 may be disposed on the first electrode branch portion AE2 to extend in the second direction DR2. The first contact electrode CTE1 may contact one end of the light-emitting element ED. The light-emitting element ED may be electrically connected to the first electrode AE through the first contact electrode CTE1.

The first contact electrode CTE1 may directly contact an upper surface of one end portion of the second element insulating layer QPAS2.

The second contact electrode CTE2 may be disposed on the second electrode branch portion CE2 to extend in the second direction DR2. The second contact electrode CTE2 may be spaced apart from the first contact electrode CTE1 in the first direction DR1. The second contact electrode CTE2 may contact the other end of the light-emitting element ED. The light-emitting element ED may be electrically connected to the second electrode CE through the second contact electrode CTE2.

The second contact electrode CTE2 may directly contact an upper surface of the other end portion of the second element insulating layer QPAS2.

The first contact electrode CTE1 and the second contact electrode CTE2 may be disposed on the same layer. Each of the first contact electrode CTE1 and the second contact electrode CTE2 may expose an upper surface of a central portion of the second element insulating layer QPAS2.

Each of the first contact electrode CTE1 and the second contact electrode CTE2 may include (or contain) a conductive material. The first contact electrode CTE1 may include (or contain) a first material, and the second contact electrode CTE2 may include (or contain) a second material. However, the first material and the second material may have different physical properties. A detailed description of this will be described later.

Figure 5:
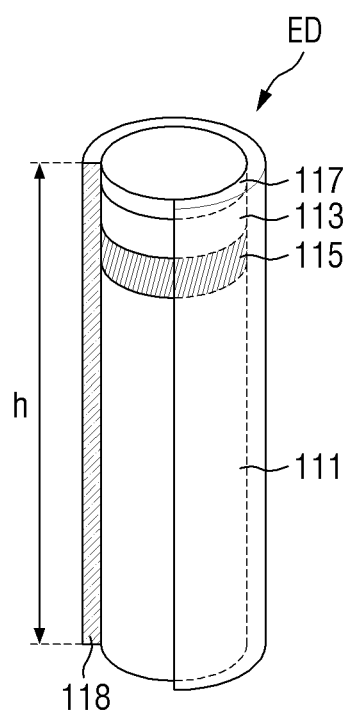
FIG. 5 is a view showing a light-emitting element according to an embodiment.

FIG. 5 is a view showing a light-emitting element according to an exemplary embodiment.

Referring to FIG. 5, a light-emitting element ED may be a light-emitting diode. For example, the light-emitting element ED may have a size of a micro-meter or a nano-meter and may be an inorganic light-emitting diode including (or containing) an inorganic material. The inorganic light-emitting diode may be aligned between two electrodes according to an electric field formed in a specific direction between the two electrodes facing each other.

The light-emitting element ED may have a shape extending in one direction. The light-emitting element ED may have a shape such as a rod, a wire, or a tube. The light-emitting element ED may include a first semiconductor layer 111, a second semiconductor layer 113, an active layer 115, an electrode layer 117, and an insulating layer 118.

The first semiconductor layer 111 may be an n-type semiconductor. The second semiconductor layer 113 may be disposed on the active layer 115. Each of the first and second semiconductor layers 111 and 113 may be formed of one layer (e.g., may have a single-layer structure), but the present disclosure is not limited thereto.

The active layer 115 may be disposed between the first and second semiconductor layers 111 and 113. The active layer 115 may include (or contain) a material having a single or multiple quantum well structure. When the active layer 115 includes a material having a multiple quantum well structure, a plurality of quantum layers and well layers may be alternately stacked.

Light emitted from the active layer 115 may be emitted in a longitudinal direction of the light-emitting element ED and may also be emitted to side surfaces of the light-emitting element ED. The directionality of the light emitted from the active layer 115 may not be limited.

The electrode layer 117 may be an ohmic contact electrode. As another example, the electrode layer 117 may be a Schottky contact electrode. The light-emitting element ED may include at least one electrode layer 117.

The insulating layer 118 may surround (e.g., may extend around a periphery of) outer surfaces of the plurality of semiconductor layers 111, 113 and the electrode layers 117. The insulating layer 118 may also surround (e.g., may also extend around a periphery of) an outer surface of the active layer 115 and may extend in a direction in which the light-emitting element ED extends. The insulating layer 118 may protect the light-emitting element ED.

The insulating layer 118 may include (or contain) a material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), and the like.

An outer surface of the insulating layer 118 may be surface-treated. When manufacturing a display device, the light-emitting element ED may be sprayed onto the electrode in a state of being dispersed in an ink to be aligned.

As described above, physical properties of the first contact electrode CTE1 and the second contact electrode CTE2 may be different from each other. The physical properties of the first contact electrode CTE1 and the second contact electrode CTE2 are different from each other because etching rates for a specific etchant of the first contact electrode CTE1 and the second contact electrode CTE2 are different from each other. As will be described later in a method of manufacturing the display device to be described with reference to FIGS. 6 to 17, the etching rate of the first contact electrode CTE1 may be lower than the etching rate of the second contact electrode CTE2 for the specific etchant. This is to prevent or substantially prevent the first contact electrode CTE1, which is formed earlier, from being etched by the corresponding etchant in a process of forming the second contact electrode CTE2 using the etchant.

Because both the first contact electrode CTE1 and the second contact electrode CTE2 are positioned on a path of light emitted from the light-emitting element ED, the first contact electrode CTE1 may include a transparent conductive material, and a material having a very low etching rate for the corresponding etchant of the transparent conductive material may be considered to prevent or substantially prevent the first contact electrode CTE1 from being etched in the process of forming the second contact electrode CTE2 by using the above-described etchant.

In an embodiment, the first material of the first contact electrode CTE1 and the second material of the second contact electrode CTE2 include (or contain) the same indium tin oxide (ITO), but the first material has indium tin oxide (ITO) crystallized by heat treatment. Accordingly, an etching rate for the etchant of the first contact electrode CTE1 may be designed to be very small. The etching rate for the etchant of the first contact electrode CTE1 and the second contact electrode CTE2 may be one of the different physical properties of the first material and the second material described above, and in addition, sheet resistance or transmittance for a specific wavelength may differ. For example, in an embodiment, a difference in sheet resistance between the first material and the second material, or transmittance for a specific wavelength, is a physical property generated based on the presence or absence of crystallization of indium tin oxide (ITO).

First, when the etching rate for the specific etchant from among the physical properties of the first material and the second material is considered, an etching rate for a phosphoric acid-based etchant of the first material may be close to zero, and an etching rate for the phosphoric acid-based etchant of the second material may be about 0.2 to about 0.4 nm/s. In addition, an etching rate for a sulfuric acid-based etchant of the first material may be close to zero, and an etching rate for the sulfuric acid-based etchant of the second material may be about 1.5 nm/s.

Next, when the sheet resistance from among the physical properties of the first material and the second material is considered, the sheet resistance of the first material may be smaller than the sheet resistance of the second material. The sheet resistance of the first material may be about 50% or less of the sheet resistance of the second material. For example, the sheet resistance of the first material may be about 55.5 $\Omega/m^2$, and the sheet resistance of the second material may be about 136.7 $\Omega/m^2$.

Finally, when the transmittance for a specific wavelength from among the physical properties of the first material and the second material is examined, the transmittance of the first material is different from the transmittance of the second material, and the transmittance of the first material at a wavelength of about 550 nm may be greater than the transmittance of the second material at a wavelength of about 550 nm. For example, the transmittance of the first material at the wavelength of about 550 nm may be at least 5% greater than the transmittance of the second material at the wavelength of about 550 nm.

Hereinafter, the transmittances of the first material and the second material based on a wavelength will be described in more detail with reference to FIG. 18.

Figure 18:
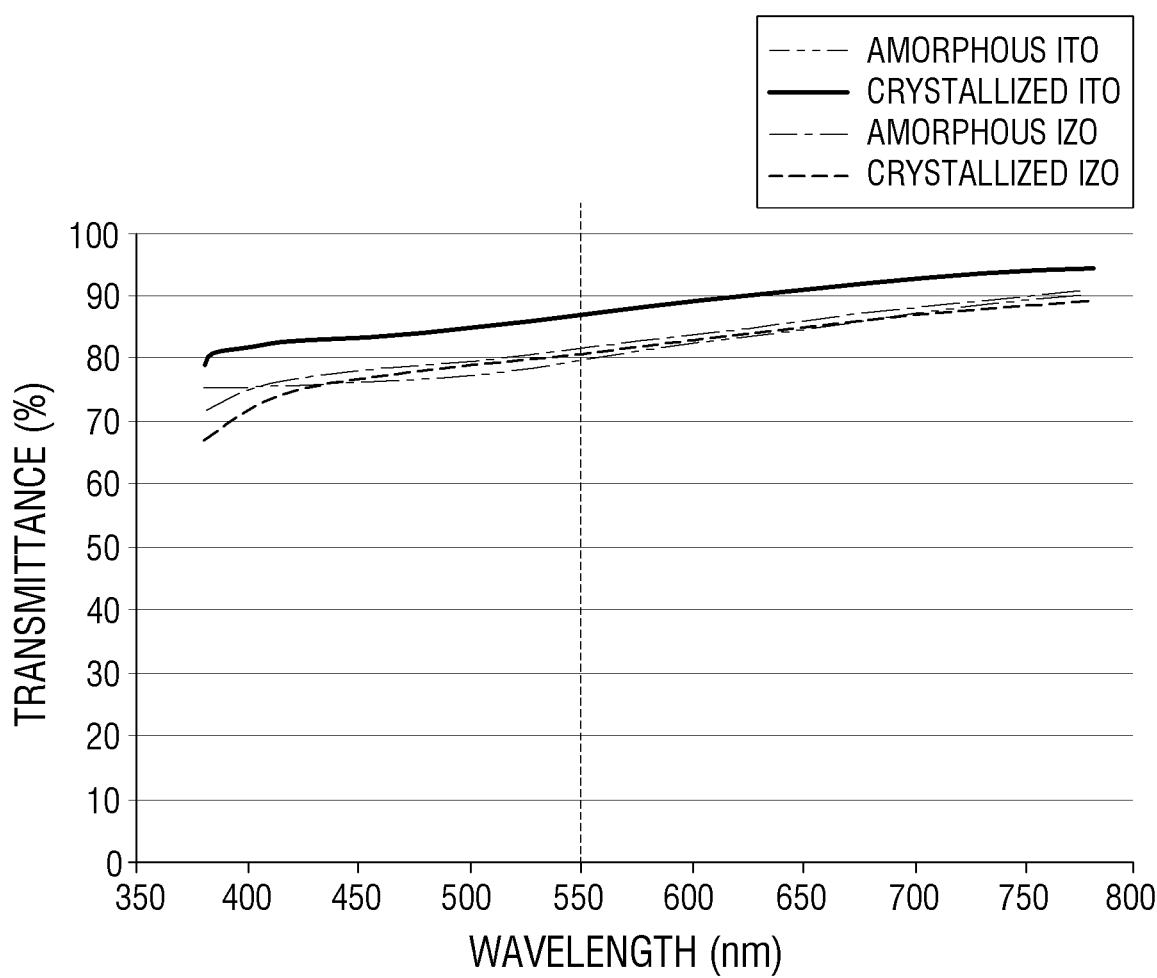
FIG. 18 is a graph showing transmittances of amorphous ITO, crystalline ITO, amorphous IZO, and crystalline IZO according to a wavelength of light.

FIG. 18 is a graph showing transmittances of amorphous ITO, crystalline ITO, amorphous IZO, and crystalline IZO according to a wavelength of light.

In FIG. 18, the horizontal axis represents the wavelength (nm) of light, and the vertical axis represents the transmittance (%) of light for a given wavelength band for each of amorphous indium tin oxide (ITO) (or amorphous ITO) and amorphous indium zinc oxide (IZO) (or crystalline IZO).

As shown in FIG. 18, the transmittance of light for each of amorphous ITO, crystalline ITO, amorphous IZO, and crystalline IZO increases as the wavelength band increases. For example, it can be seen that the crystalline ITO maintains a higher transmittance than the amorphous ITO, crystalline IZO, and amorphous IZO. It can be seen that, for light in a wavelength band of about 550 nm, the transmittance of the crystalline ITO is about 88% while the transmittance of the amorphous ITO is about 80%.

Hereinafter, another embodiment will be described.

Each of the first material and the second material according to the present embodiment may include (or contain) a transparent conductive material, and the first material and the second material are different from each other and may have different physical properties.

According to the present embodiment, the first material may include (or contain) indium tin oxide (ITO), and the second material may include (or contain) indium zinc oxide (IZO). The first material may be crystallized indium tin oxide (ITO) or amorphous indium tin oxide (ITO). Hereinafter, an embodiment in which the first material is amorphous indium tin oxide (ITO) will be primarily described.

The physical properties of the first contact electrode CTE1 and the second contact electrode CTE2 are different from each other because etching rates of a specific etchant of the first contact electrode CTE1 and the second contact electrode CTE2 are different from each other, and the etching rate of the first contact electrode CTE1 may be lower than the etching rate of the second contact electrode CTE2 for the specific etchant.

In the present embodiment, the etching rate for the etchant of the first contact electrode CTE1 may be formed to be very small by designing the first material of the first contact electrode CTE1 and the second material of the second contact electrode CTE2 to include (or contain) different materials, such as indium tin oxide (ITO) and indium zinc oxide (IZO).

The etching rate for the etchant of the first contact electrode CTE1 and the second contact electrode CTE2 is one of the different physical properties of the first material and the second material described above, and in addition, a difference in sheet resistance is a physical property generated as the first material and the second material have different materials from each other.

First, when the etching rate for the specific etchant from among the physical properties of the first material and the second material is considered, an etching rate for a phosphoric acid-based etchant or a sulfuric acid-based etchant of the second material may be about 5 times or more an etching rate for the phosphoric acid-based etchant or the sulfuric acid-based etchant of the first material.

The etching rate for a phosphoric acid-based etchant of the first material may be about 0.2 to about 0.4 nm/s, and the etching rate for the phosphoric acid-based etchant of the second material may be about 1.5 to about 2.5 nm/s. In addition, the etching rate for a sulfuric acid-based etchant of the first material may be about 1.5 nm/s, and the etching rate of the sulfuric acid-based etchant of the second material may be about 7.5 nm/s.

Next, when the sheet resistance from among the physical properties of the first material and the second material is considered, the sheet resistance of the first material may be greater than the sheet resistance of the second material. The sheet resistance of the first material may be about 1.5 times or more the sheet resistance of the second material. For example, the sheet resistance of the first material may be about 136.7 $\Omega/m^2$, and the sheet resistance of the second material may be about 71.3 $\Omega/m^2$.

Hereinafter, a method of manufacturing a display device according to an embodiment will be described. In the following embodiment, the same components as those of the embodiments already described will be referred to with the same reference numerals, and the description thereof may be omitted or simplified.

Figure 6:
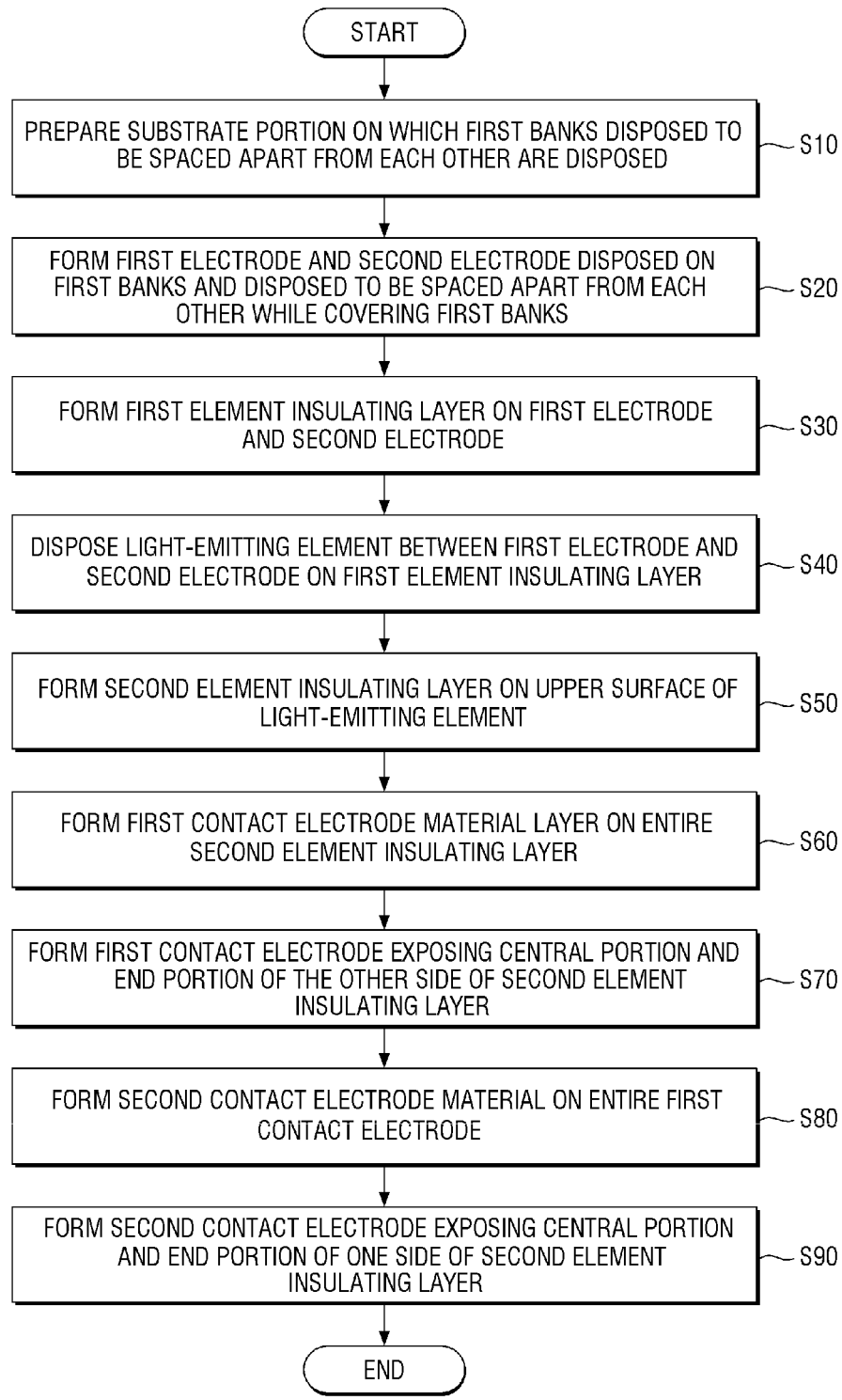
FIG. 6 is a flowchart showing aspects of a method of manufacturing a display device according to an embodiment.

FIG. 6 is a flowchart showing a method of manufacturing a display device according to an embodiment, and FIGS. 7 to 17 are cross-sectional views for processes of the method of manufacturing a display device according to an embodiment.

Figure 7:
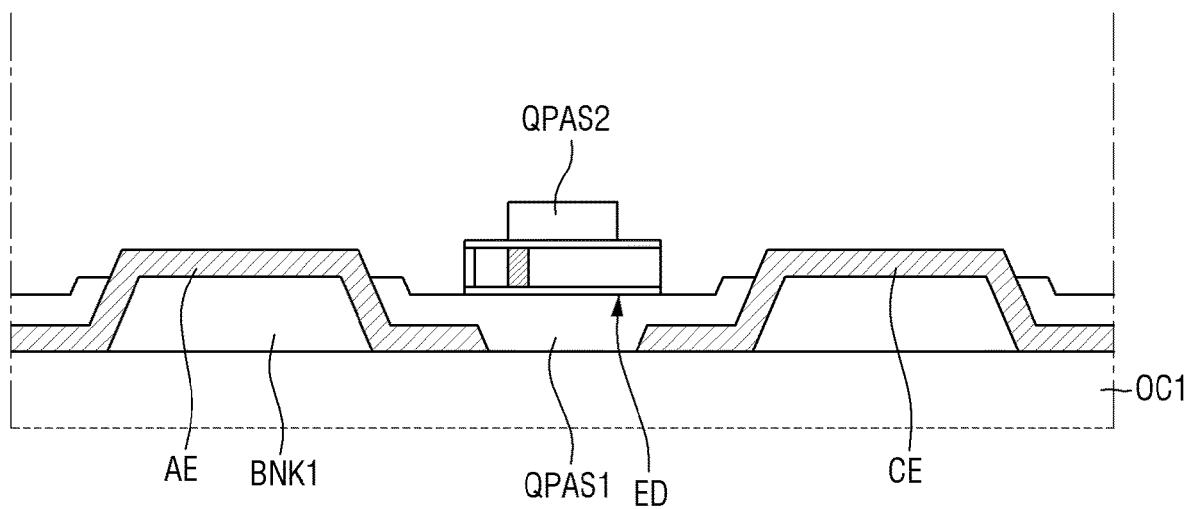
FIGS. 7 to 17 are cross-sectional views of processes of a method of manufacturing a display device according to an embodiment.

Referring to FIGS. 6 and 7 along with FIGS. 1 to 5, the method of manufacturing a display device according to an embodiment includes a substrate preparation operation (S10) of preparing a substrate portion on which first banks BNK1 disposed to be spaced apart from each other are disposed.

Subsequently, the method of manufacturing a display device according to an embodiment includes an electrode forming operation (S20) of forming a first electrode AE and a second electrode CE disposed on the first bank BNK1 and disposed to be spaced apart from each other while covering the first bank BNK1.

Subsequently, the method of manufacturing a display device according to an embodiment includes a first element insulating layer forming operation (S30) of forming a first element insulating layer QPAS1 on the first electrode AE and the second electrode CE.

Subsequently, a light-emitting element disposing operation (S40) of disposing a light-emitting element ED between the first electrode AE and the second electrode CE on the first element insulating layer QPAS1 is included.

Then, a second element insulating layer forming operation (S50) of forming a second element insulating layer QPAS2 on an upper surface of the light-emitting element ED is included. The second element insulating layer QPAS2 may be formed in a central portion of the upper surface of the light-emitting element ED.

Figure 8:
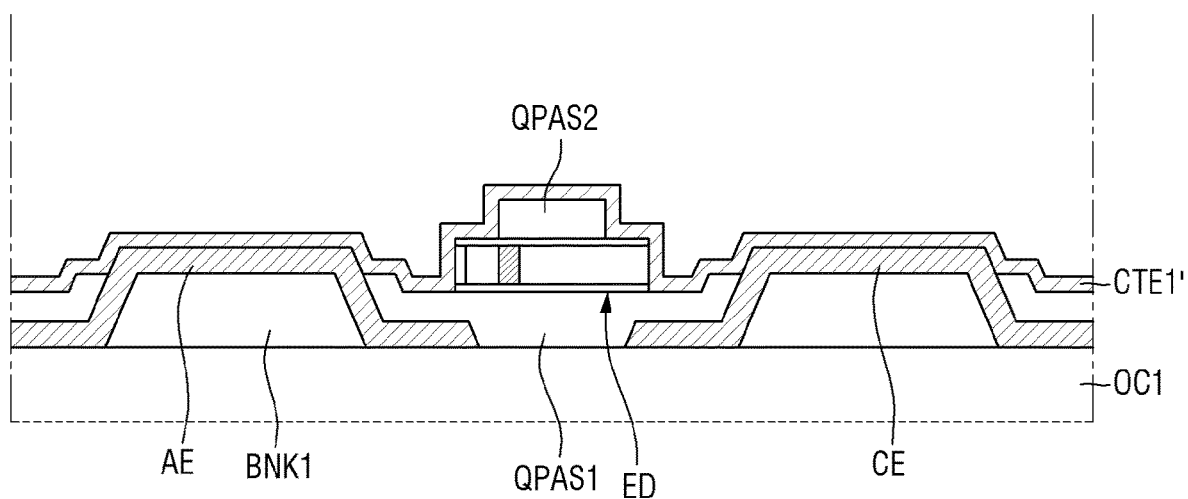

Next, referring to FIGS. 6 and 8 along with FIGS. 1 to 5, the method of manufacturing a display device according to an embodiment may include a first contact electrode material forming operation (S60) of forming a first contact electrode material layer CTE1' on the entire second element insulating layer QPAS2. The first contact electrode material layer CTE1' may include (or contain) a transparent conductive material. The first contact electrode material layer CTE1' may include indium tin oxide (ITO).

Subsequently, referring to FIGS. 6 and 9 to 11 along with FIGS. 1 to 5, the method of manufacturing a display device according to an embodiment includes a first contact electrode forming operation (S70) of forming a first contact electrode CTE1 exposing a central portion and an end portion of the other side of the second element insulating layer QPAS2.

Figure 10:
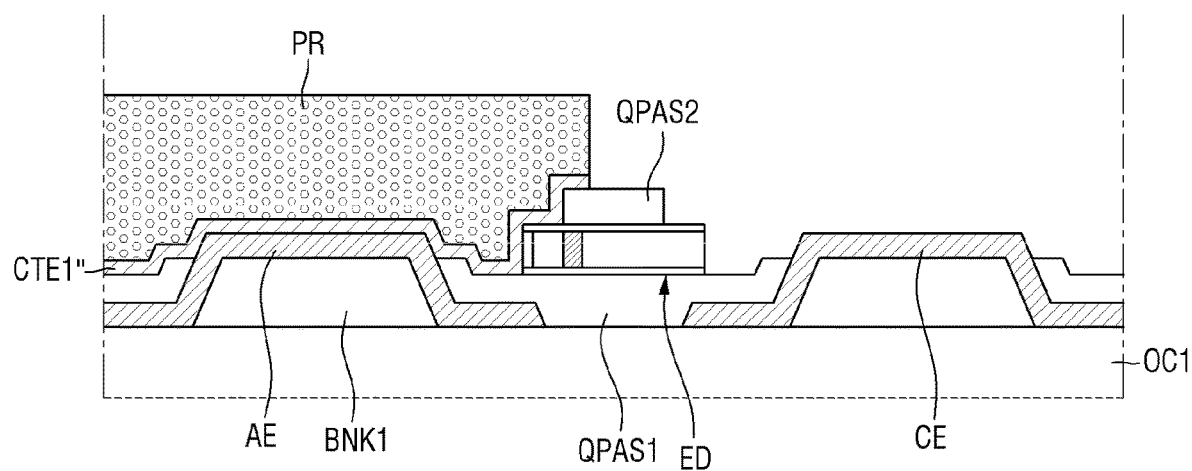
Figure 11:
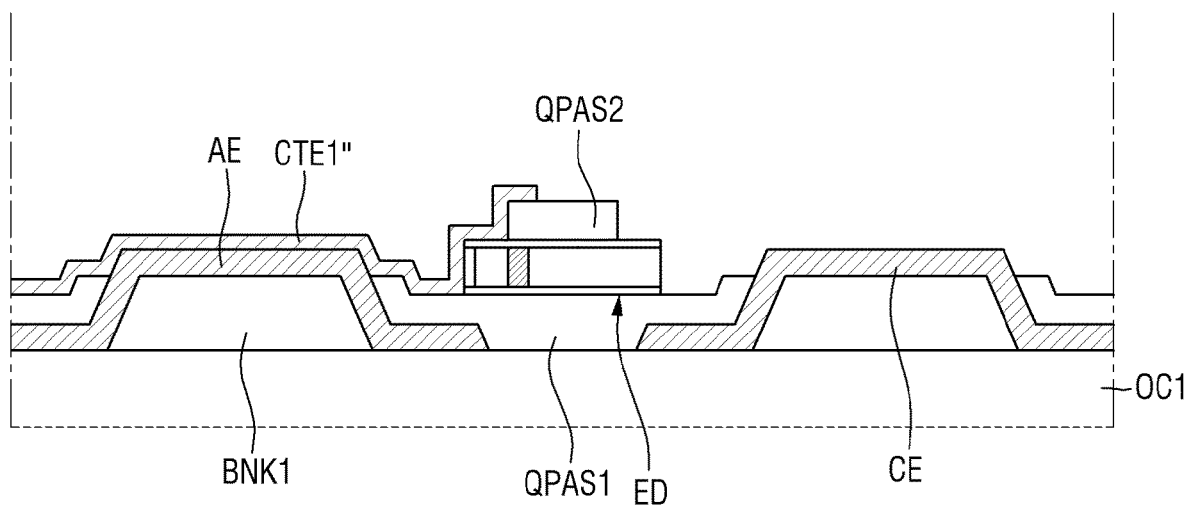

As shown in FIGS. 10 and 11, the first contact electrode forming operation (S70) may be performed through (e.g., by using) a photolithography process.

Figure 9:
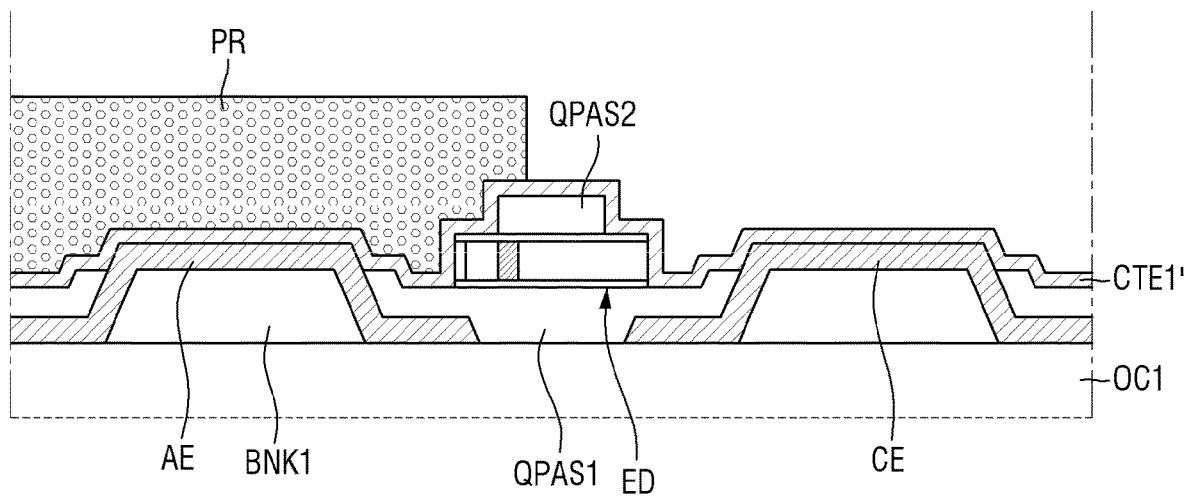

For example, as shown in FIG. 9, the first contact electrode forming operation (S70) may include forming a photoresist PR so as to cover one side area including an area overlapping an upper surface (e.g., one end of an upper surface) positioned in one direction based on the central portion of the upper surface of the second element insulating layer QPAS2 of the first contact electrode material layer CTE1', exposing an area exposed by the photoresist PR, etching and removing an exposed area of the first contact electrode material layer CTE1', and stripping the photoresist PR.

The etching of the exposed area may be performed through (e.g., by using) wet etching.

Figure 12:
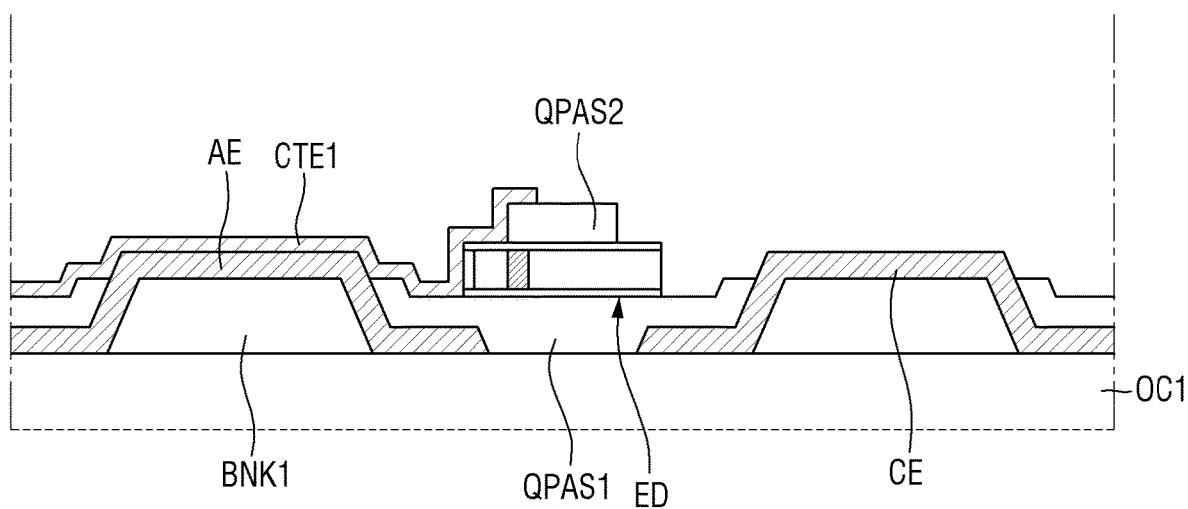

Next, referring to FIGS. 6 and 12 along with FIGS. 1 to 5, the method of manufacturing a display device according to an embodiment may further include a first contact electrode crystallization operation in which the formed first contact electrode (CTE1) is heat-treated and crystallized. The first contact electrode CTE1 is formed through the first contact electrode crystallization operation.

Figure 13:
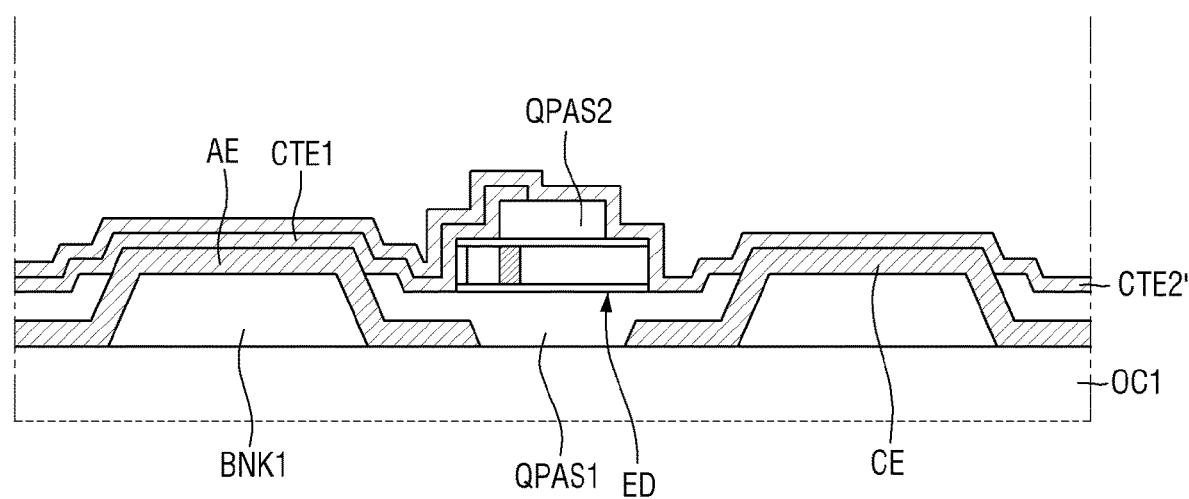

Subsequently, referring to FIGS. 6 and 13 along with FIGS. 1 to 5, the method of manufacturing a display device according to an embodiment includes a second contact electrode material forming operation (S80) of forming a second contact electrode material CTE2' on the entire first contact electrode CTE1.

The second contact electrode material layer CTE2' may include a transparent conductive material. The second contact electrode material layer CTE2' may include indium tin oxide (ITO).

Subsequently, referring to FIGS. 6 and 14 to 16 along with FIGS. 1 to 5, the method of manufacturing a display device according to an embodiment includes a second contact electrode forming operation (S90) of forming a second contact electrode CTE2 exposing a central portion and an end portion of the other side of the second element insulating layer QPAS2.

Figure 14:
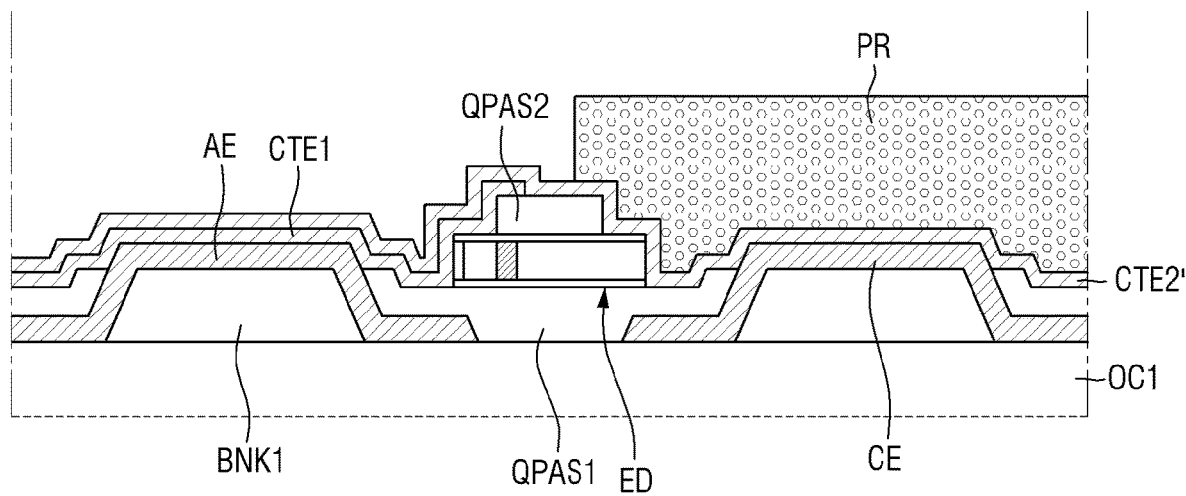
Figure 15:
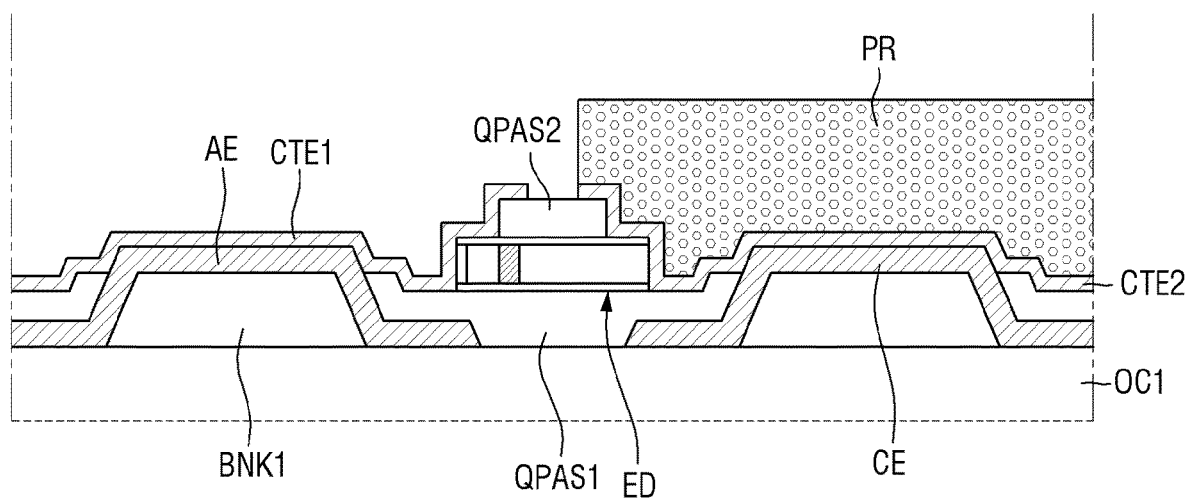

As shown in FIGS. 14 and 15, the second contact electrode forming operation (S90) may be performed through a photolithography process.

For example, as shown in FIG. 14, the second contact electrode forming operation (S90) may include forming a photoresist PR to cover the other side area including an area overlapping an upper surface (e.g., end portion of the other side of an upper surface) positioned in the other direction based on the central portion of the upper surface of the second element insulating layer QPAS2 of the second contact electrode material layer CTE2', exposing an area exposed by the photoresist PR, etching and removing an exposed area of the second contact electrode material layer CTE2', and stripping the photoresist PR.

The etching of the exposed area may be performed through wet etching. In this embodiment, an etchant may include a phosphoric acid-based etchant or a sulfuric acid-based etchant.

In the operation of etching and removing the exposed area of the second contact electrode material layer CTE2', because the first contact electrode CTE1 positioned under the second contact electrode material layer CTE2' has a very small etching rate for the etchant compared to the second contact electrode material layer CTE2' as described above, the first contact electrode CTE1 may be barely etched by the etchant in the corresponding operation.

Figure 16:
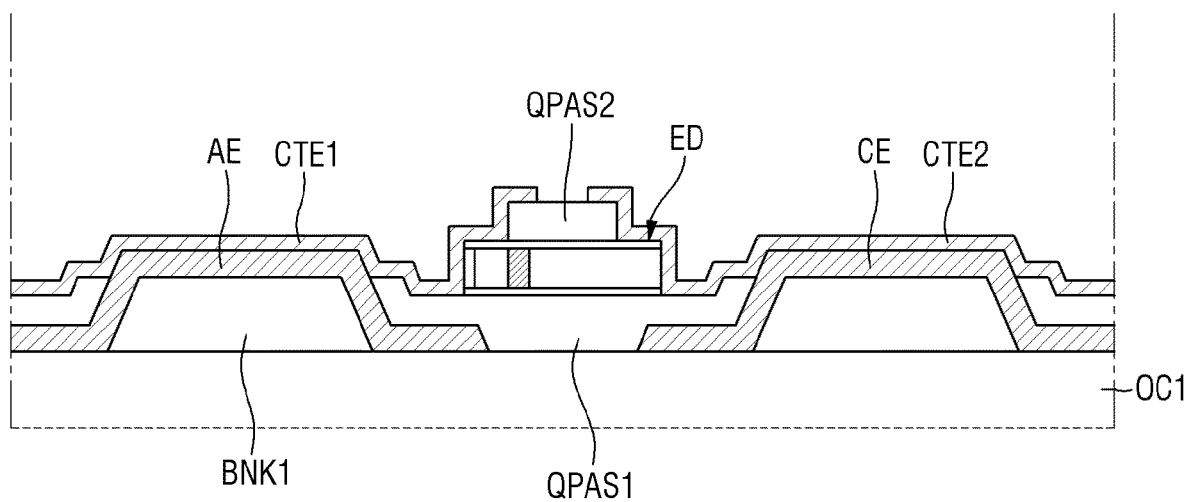

Thus, as shown in FIG. 16, the first contact electrode CTE1 and the second contact electrode CTE2 may be formed so that the upper surface of the central portion of the second element insulating layer QPAS2 is exposed.

Figure 17:
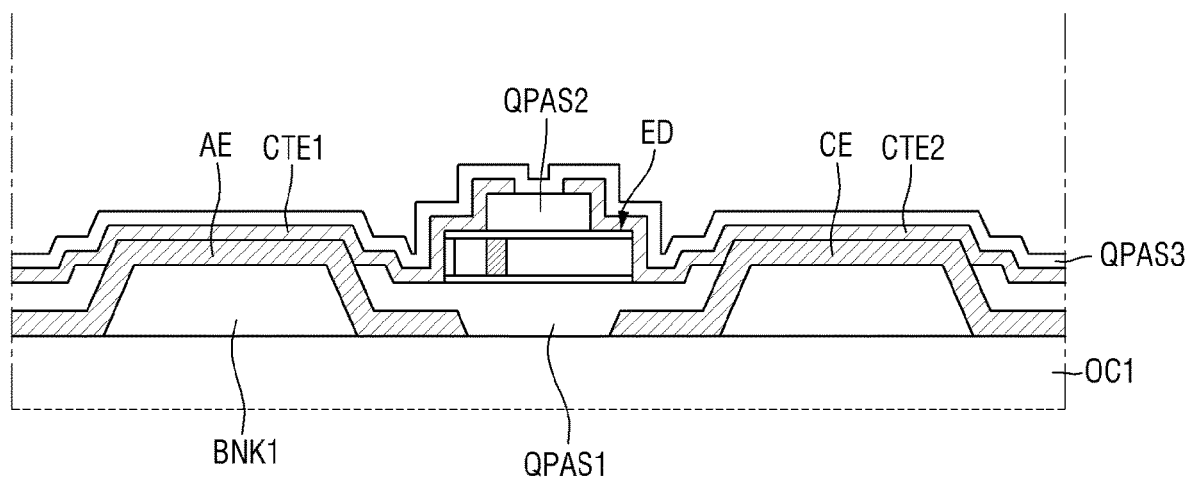

Next, referring to FIGS. 6 and 17, the first contact electrode CTE1 and the second contact electrode CTE2 are integrally covered, and thus, a third element insulating layer QPAS3 contacting the corresponding first contact electrode CTE1 and second contact electrode CTE2 is formed on the first contact electrode CTE1 and the second contact electrode CTE2.

According to the present embodiment, because the first contact electrode CTE1 and the second contact electrode CTE2 are formed on the same layer, it is no need to form two or more element insulating layers to individually cover the first contact electrode CTE1 and the second contact electrode CTE2, and the first contact electrode CTE1 and the second contact electrode CTE2 may be covered and protected only by the third element insulating layer QPAS3. Accordingly a process of manufacturing a display device may be simplified by omitting a separate deposition process.

Another embodiment of a method of manufacturing a display device differs from the method of manufacturing a display device according to the above-described embodiment in that a first contact electrode material layer CTE1' includes (or contains) indium tin oxide (ITO), and a second contact electrode material layer CTE2' includes (or contains) indium zinc oxide (IZO). The other processes of the method are the same or substantially the same, and thus, a detailed description thereof may be omitted.

Hereinafter, another embodiment of a display device will be described. In the following embodiment, the same components as those of the embodiments already described will be referred to with the same reference numerals, and the description thereof may be omitted or simplified.

Figure 19:
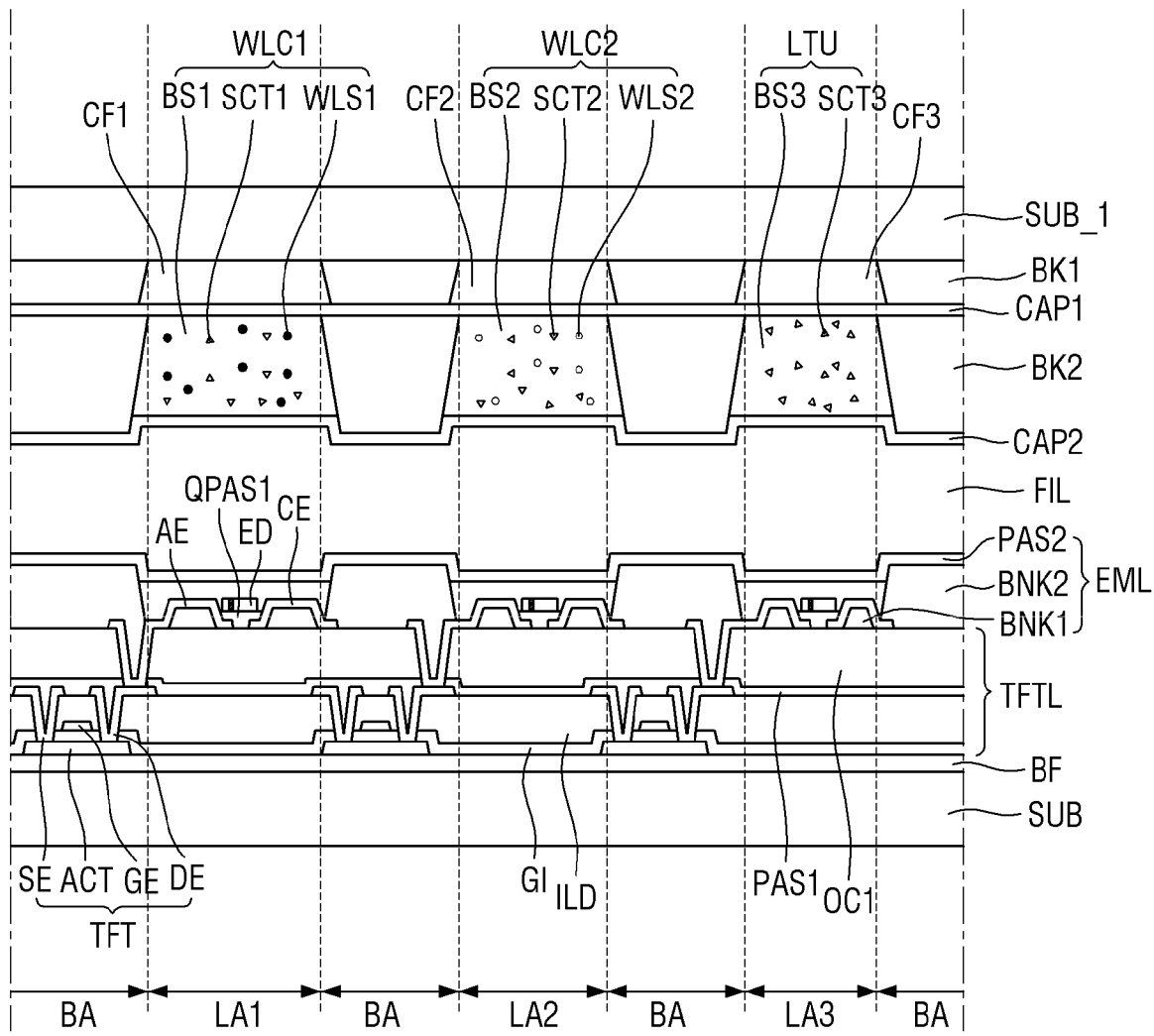
FIG. 19 is a cross-sectional view of a display device according to an embodiment.

FIG. 19 is a cross-sectional view of a display device according to another embodiment.

Referring to FIG. 19, the display device according to the present embodiment differs from the display device shown in FIG. 2 in that an upper substrate portion SUB_1 facing a substrate portion SUB is further included.

For example, the upper substrate portion SUB_1 faces the substrate portion SUB. The upper substrate portion SUB_1 may include the same material as the material of the substrate portion SUB described above.

A first light blocking member BK1 is disposed on one surface of the upper substrate portion SUB_1 facing the substrate portion SUB. The first light blocking member BK1 may be disposed in a light blocking area BA.

First to third color filters CF1, CF2, and CF3 may be disposed on the first light blocking member BK1 and one surface of the upper substrate portion SUB_1 facing the substrate portion SUB. The first color filter CF1 may be disposed in a first light-emitting area LA1, the second color filter CF2 may be disposed in a second light-emitting area LA2, and the third color filter CF3 may be disposed in a third light-emitting area LA3.

A first capping layer CAP1 may be disposed on the first to third color filters CF1, CF2, and CF3. A second light blocking member BK2 may be disposed on the first capping layer CAP1. The second light blocking member BK2 may be disposed in the light blocking area BA. First and second wavelength conversion units WLC1 and WLC2 and a light transmission unit LTU may be disposed between adjacent second light blocking members BK2. A second capping layer CAP2 may be disposed on the first and second wavelength conversion units WLC1 and WLC2, the light transmission unit LTU, and the second light blocking member BK2.

A filling layer FIL may be disposed between a first protective layer PAS1 and the second capping layer CAP2.

According to a display device and a method of manufacturing the display device according to embodiments of the present disclosure, a first contact electrode and a second contact electrode are formed on the same layer, and the first contact electrode and the second contact electrode can be more easily formed regardless of the resolution of an exposure machine or an overlay ability of the exposure machine.

Aspects and features of the present disclosure are not limited to those discussed herein, and more various aspects and features are included in the present disclosure.

Although embodiments of the present disclosure have been disclosed for illustrative purposes, those skilled in the art will appreciate that various modifications, additions, and substitutions are possible without departing from the scope and spirit of the present disclosure as disclosed in the accompanying claims and their equivalents.

What is claimed is:

1. A display device comprising:
   a substrate;
   first banks spaced apart from each other on the substrate;
   a first electrode and a second electrode covering the first banks and spaced apart from each other;
   a light-emitting element between the first electrode and the second electrode;
   a first contact electrode connected to the first electrode and contacting one end of the light-emitting element; and
   a second contact electrode connected to the second electrode and contacting another end of the light-emitting element,
   wherein the first contact electrode comprises crystallized indium tin oxide, and the second contact electrode comprises amorphous indium tin oxide.

2. The display device of claim 1, wherein an etching rate for a phosphoric acid-based etchant or a sulfuric acid-based etchant of the first contact electrode is lower than an etching rate for the phosphoric acid-based etchant or the sulfuric acid-based etchant of the second contact electrode.

3. The display device of claim 1, wherein sheet resistance of the first contact electrode is less than sheet resistance of the second contact electrode, and
   wherein the sheet resistance of the first contact electrode is 50% or less of the sheet resistance of the second contact electrode.

4. The display device of claim 1, wherein transmittance of the first contact electrode is different from transmittance of the second contact electrode.

5. The display device of claim 4, wherein the transmittance of the first contact electrode for light having a wavelength of 550 nm is greater than the transmittance of the second contact electrode for light having the wavelength of 550 nm.

6. The display device of claim 5, wherein the transmittance of the first contact electrode for light having the wavelength of 550 nm is at least 5% higher than the transmittance of the second contact electrode for light having the wavelength of 550 nm.

7. The display device of claim 1, further comprising:
   a first element insulating layer between the first electrode and the second electrode and the light-emitting element; and
   a second element insulating layer on an upper surface of the light-emitting element,
   wherein the first contact electrode directly contacts an upper surface of one side of the second element insulating layer,
   wherein the second contact electrode directly contacts an upper surface of another side of the second element insulating layer, and
   wherein each of the first contact electrode and the second contact electrode exposes an upper surface of a central portion of the second element insulating layer.

8. The display device of claim 7, further comprising a third element insulating layer integrally covering and contacting the first contact electrode and the second contact electrode.

9. A display device comprising:
   a substrate;
   first banks spaced apart from each other on the substrate;
   a first electrode and a second electrode covering the first banks and spaced apart from each other;
   a light-emitting element between the first electrode and the second electrode;
   a first contact electrode connected to the first electrode and contacting one end of the light-emitting element; and
   a second contact electrode connected to the second electrode and contacting another end of the light-emitting element,
   wherein the first contact electrode comprises indium tin oxide, and the second contact electrode comprises indium zinc oxide.

10. The display device of claim 9, wherein an etching rate for a phosphoric acid-based etchant or a sulfuric acid-based etchant of the second contact electrode is 5 times or more an etching rate for the phosphoric acid-based etchant or the sulfuric acid-based etchant of the first contact electrode.

11. A method of manufacturing a display device, the method comprising:
   a substrate preparation operation of preparing a substrate on which first banks that are spaced apart from each other are arranged;
   an electrode forming operation of forming a first electrode and a second electrode covering the first banks and spaced apart from each other;
   a first element insulating layer forming operation of forming a first element insulating layer on the first electrode and the second electrode;
   a light-emitting element disposing operation of disposing a light-emitting element between the first electrode and the second electrode on the first element insulating layer;
   a second element insulating layer forming operation of forming a second element insulating layer on an upper surface of the light-emitting element;
   a first contact electrode material forming operation of forming a first contact electrode material layer on the entire second element insulating layer;
   a first contact electrode forming operation of forming a first contact electrode exposing a central portion and an end portion of another side of the second element insulating layer;
   a second contact electrode material forming operation of forming a second contact electrode material on the entire first contact electrode; and a second contact electrode forming operation of forming a second contact electrode exposing a central portion and an end portion of one side of the second element insulating layer,
wherein the first contact electrode comprises crystallized indium tin oxide, and the second contact electrode comprises amorphous indium tin oxide.

12. The method of claim 11, wherein sheet resistance of the first contact electrode is 50% or less of sheet resistance of the second contact electrode.

13. The method of claim 11, wherein transmittance of the first contact electrode for light having a wavelength of 550 nm is larger than transmittance of the second contact electrode for light having the wavelength of 550 nm.

14. The method of claim 11, wherein the first contact electrode forming operation further comprises a first contact electrode crystallization process of heat-treating the first contact electrode.

15. The method of claim 11, wherein the first contact electrode forming operation and the second contact electrode forming operation are performed through a photolithography process.

* * * * *